(12) United States Patent
Taguchi et al.

(10) Patent No.: US 11,712,783 B2
(45) Date of Patent: Aug. 1, 2023

(54) HUBBED BLADE

(71) Applicant: DISCO CORPORATION, Tokyo (JP)

(72) Inventors: Ryoji Taguchi, Tokyo (JP); Takashi Fukazawa, Tokyo (JP); Takayuki Gawazawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 465 days.

(21) Appl. No.: 16/833,990

(22) Filed: Mar. 30, 2020

(65) Prior Publication Data

US 2020/0324391 A1 Oct. 15, 2020

(30) Foreign Application Priority Data

Apr. 11, 2019 (JP) .............................. JP2019-075445

(51) Int. Cl.
*B24D 5/12* (2006.01)
*B28D 5/02* (2006.01)
*B24D 5/16* (2006.01)
*H01L 21/67* (2006.01)

(52) U.S. Cl.
CPC ................. *B24D 5/12* (2013.01); *B24D 5/16* (2013.01); *B28D 5/022* (2013.01); *H01L 21/67092* (2013.01)

(58) Field of Classification Search
CPC ... B24D 5/02; B24D 5/12; B24D 5/16; B24D 18/0072; B24D 18/00; B24D 23/005; B24D 23/02; B24D 23/028; B24D 41/04; B24D 45/00; B24D 45/003; B24D 45/006; B24D 55/052

USPC ................ 451/178, 344, 358, 360, 541, 544
See application file for complete search history.

(56) References Cited

U.S. PATENT DOCUMENTS 9,724,838 B2 * 8/2017 Wakita ..................... B26D 7/22
10,898,989 B2 * 1/2021 Li .......................... B24D 5/066

FOREIGN PATENT DOCUMENTS

| CN | 1927537 A | 3/2007 | |
|---|---|---|---|
| CN | 106182476 A | 12/2016 | |
| DE | 102013204922 A1 | 9/2014 | |
| JP | S6235764 U | 3/1987 | |
| JP | 2002178268 A | 6/2002 | |
| JP | 2007073586 A | 3/2007 | |
| JP | 2012135833 A | 7/2012 | |
| JP | 2016221637 A | * 12/2016 | ............... B24D 5/12 |

OTHER PUBLICATIONS

Machine translation of JP2016221637 (Year: 2016).*

(Continued)

*Primary Examiner* — Orlando E Aviles
*Assistant Examiner* — Robert F Neibaur
(74) *Attorney, Agent, or Firm* — Greer, Burns & Crain, Ltd.

(57) ABSTRACT

A hubbed blade to be mounted on a spindle includes a circular hub and a circular blade fixed on a side of a first side of the hub. The blade has an opening formed through its center. The hub includes a protrusion portion protruding from the first side and having an outer peripheral edge of a shape corresponding to a shape of the opening. The hub and the blade are connected together via an adhesive with the hub and the blade being aligned each other with the protrusion portion inserted in the opening.

4 Claims, 5 Drawing Sheets

(56) References Cited

OTHER PUBLICATIONS

Office Action issued in counterpart Singapore patent application No. 10202002645Q, dated Mar. 30, 2021.
Taguchi Ryoji, U.S. Appl. No. 16/833,949, filed Mar. 30, 2020.
JP Office Action for corresponding JP Patent Application No. 2019-075445 dated Nov. 4, 2022 (3 pages).
Japanese translated Office Action for corresponding Japanese Patent Application No. 2019-075445 dated May 30, 2023 (4 pages).

* cited by examiner

HUBBED BLADE

BACKGROUND OF THE INVENTION

Field of the Invention

The present invention relates to a hubbed blade to be mounted on a spindle.

Description of the Related Art

By dividing a semiconductor wafer that has a plurality of devices such as integrated circuits (ICs) or large scale integrations (LSIs), the like plurality of device chips with the devices included therein, respectively, are fabricated. Further, by dividing a package substrate that has been formed by coating, with a sealing material (molding resin), a plurality of device chips mounted on a substate, the like plurality of package devices is fabricated including the device chips covered with the molding resin.

For the division of a workpiece represented by the above-described semiconductor wafer or package substrate, a cutting apparatus including a spindle with a blade mounted thereon to cut the workpieces is used, for example. The blade mounted on the spindle is rotated and cut into the workpiece, whereby the workpiece is out. As blades for use in cutting such workpieces, there are known electroformed hub blades including a cutting blade with abrasive grains of diamond or the like fixed by a plating of nickel or the like, circular blades including a cutting blade with abrasive grains fixed with a bonding material of metal, ceramic or resin, and the like. Upon cutting a workpiece, an appropriate blade is selected as desired according to the material and the like of the workpiece.

An electroformed hub blade is configured as an integral unit of a disk-shaped hub made of aluminum or the like and a circular cutting blade formed along an outer peripheral edge of the hub, and is mounted on a blade mount fixed on a distal end portion of a spindle which is incorporated in a cutting apparatus. On the other hand, a circular blade is mounted on a distal end portion of a spindle so that the circular blade is held between a flange portion (fixed flange) included in a blade mount and a detachable flange. As is appreciated from the foregoing, the electroformed hub blade and the circular blade are different in the manner of mounting on the spindle, and therefore the shape, dimensions and the like of the blade mount to be fixed on the spindle are also different depending on the type of the blade. Upon replacement of the circular blade for the electroformed hub blade, for example, a need arises to also replace the blade mount, resulting in blade replacement work of poor efficiency. In recent years, hubbed blades with a circular blade bonded on a disk-shaped hub have been proposed accordingly (see, for example, Japanese Patent Laid-open No. 2012-135833). The use of such a hubbed blade enables to mount a circular blade on a blade mount for an electroformed hub blade, thereby obviating the replacement of the blade mount.

SUMMARY OF THE INVENTION

The hubbed blade is manufactured by bonding the hub and the blade together via an adhesive. Upon bonding them together, there is a need to perform an alignment between the hub and the blade. In the bonding of the hub and the blade, a jig is hence used to bring the blade into contact with a predetermined position on the hub. However, the use of the jig for the alignment between the hub and the blade needs work to design the jig according to the dimensions of the resulting hubbed blade and also work to mount the hub and the blade on the jig. As a consequence, the bonding of the hub and the blade becomes complex, and the efficiency of manufacture of the hubbed blade is lowered.

With the foregoing problems in view, the present invention therefore has as an object thereof the provision of a hubbed blade that enables to simply and easily perform an alignment between a hub and a blade.

In accordance with an aspect of the present invention, there is provided a hubbed blade to be mounted on a spindle. The hubbed blade includes a circular hub, and a circular blade fixed on a side of a first side of the hub and having an opening formed through a center thereof. The hub includes a protrusion portion protruding from the first side and having an outer peripheral edge of a shape corresponding to a shape of the opening. The hub and the blade are connected together via an adhesive with the hub and the blade being aligned each other with the protrusion portion inserted in the opening.

The hubbed blade according to the aspect of the present invention includes the circular hub, and the circular blade fixed on the side of the first side of the hub and having the opening formed through a center thereof. The hub includes the protrusion portion protruding from the first side of the hub and having the outer peripheral edge of the shape corresponding to the shape of the opening of the blade. The hub and the blade are connected together via the adhesive with the hub and the blade being aligned each other with the protrusion portion of the hub inserted in the opening of the blade. With this hubbed blade, the alignment between the hub and the blade is performed by inserting the protrusion portion of the hub into the opening of the blade. Therefore, no jig is needed for performing the alignment, thereby enabling to simply and easily perform the alignment between the hub and the blade.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
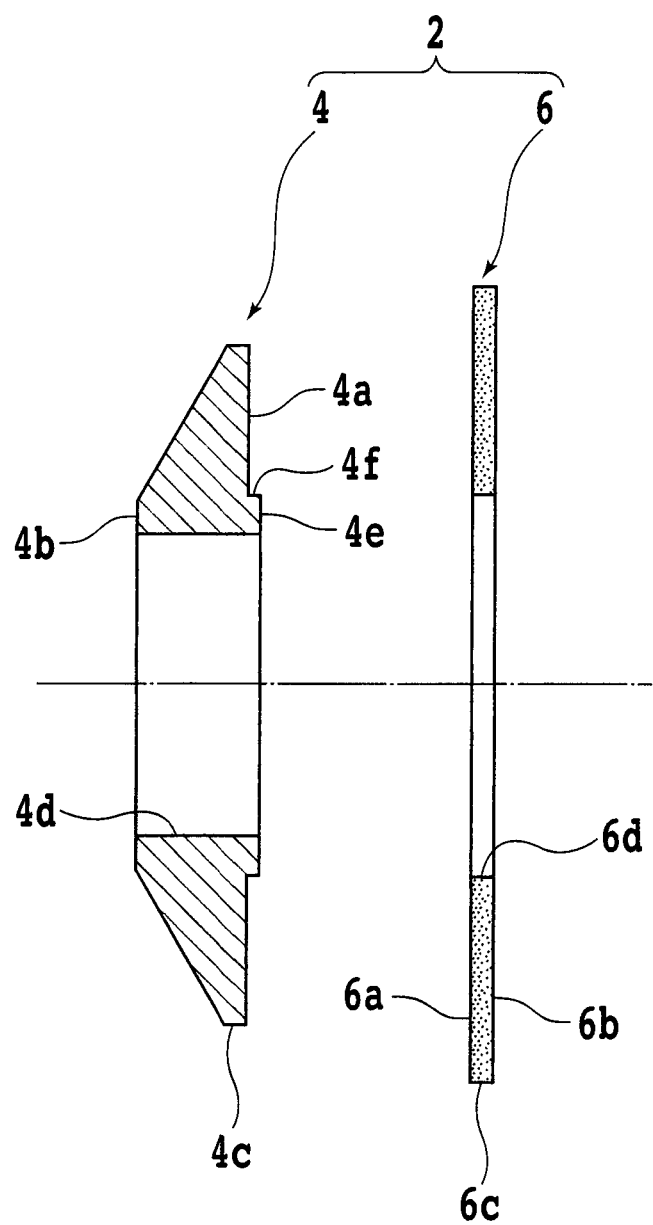
FIG. 1 is an exploded cross-sectional view depicting a hubbed blade according to an embodiment of the present invention.

With reference to the appended drawings, a description will hereinafter be made about an embodiment of the present invention. First, a description will be made about a configuration example of a hubbed blade according to this embodiment. FIG. 1 is an exploded cross-sectional view depicting the hubbed blade 2.

The hubbed blade 2 includes a circular hub 4 and a circular blade 6. The hub 4 is made, for example, of aluminum or the like, and has a first side 4a and a second side 4b, which are parallel to each other, and an outer peripheral edge 4c. At a center of the hub 4, a circular opening 4d is formed extending through the hub 4 from the first side 4a to the second side 4b. Around the opening 4d, a circular protrusion portion 4e is disposed protruding from the first side 4a toward the blade 6 so that the circular protrusion portion 4e surrounds the opening 4d. The protrusion portion 4e is formed along a contour of the opening 4d, and includes a circular outer peripheral edge 4f.

The blade 6 has been formed by fixing abrasive grains, for example, of diamond, cubic boron nitride (cBN) or the like with a bonding material of metal, ceramic, resin or the like. However, no limitation is imposed on the abrasive grain and bonding material included in the blade 6, and they can be appropriately selected according to a specification or the like of the hubbed blade 2. The blade 6 has a first side 6a and a second side 6b, which are parallel to each other, and an outer peripheral edge 6c. At a center of the blade 6, a circular opening 6d is formed extending through the blade 6 from the first side 6a to the second side 6b.

Figure 2:
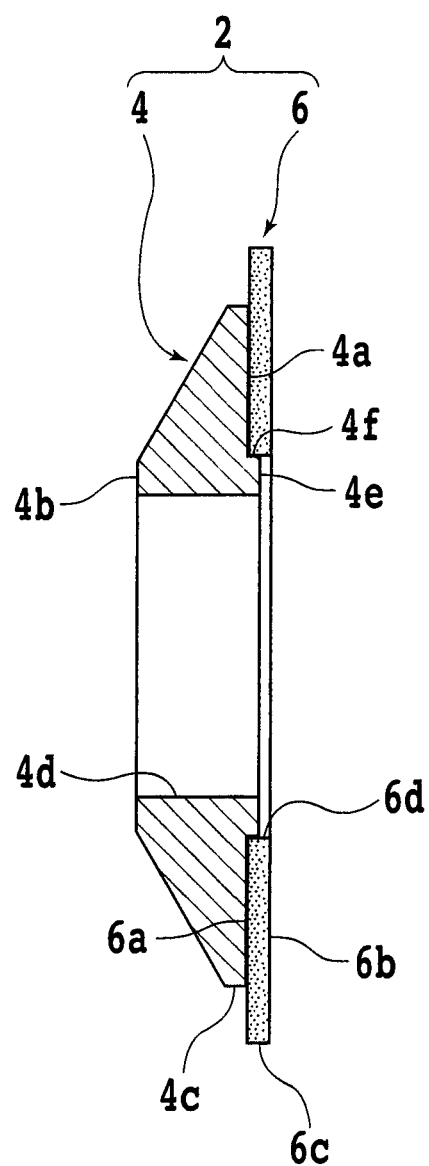
FIG. 2 is a cross-sectional view depicting the hubbed blade, in which the hub and a blade are connected together.

By bonding the hub 4 and the blade 6 via an adhesive, the hubbed blade 2 is obtained with the hub 4 and the blade 6 integrated together. FIG. 2 is a cross-sectional view depicting the hubbed blade 2 in which the hub 4 and the blade 6 are connected together. Upon bonding the hub 4 and the blade 6 together, the adhesive is first applied to the first side 4a of the hub 4. As the adhesive, an epoxy resin-based adhesive can be used, for example. The adhesive may also be applied to the outer peripheral edge 4f of the protrusion portion 4e in addition to the first side 4a. Further, the adhesive may also be applied to the blade 6. If this is the case, the adhesive is applied to the first side 6a of the blade 6 at an area facing the first side 4a of the hub 4. The first side 4a of the hub 4 and the first side 6a of the blade 6 are then placed facing each other, and the hub 4 and the blade 6 are bonded together. As a consequence, the hub 4 and the blade 6 are connected together via the adhesive.

The protrusion portion 4e of the hub 4 is formed so that the outer peripheral edge 4f has a shape corresponding the opening 6d of the blade 6. For example, the protrusion portion 4e is formed so that the outer peripheral edge 4f has a diameter equal to that of the opening 6d and has a shape conforming to the contour of the opening 6d. Upon bonding the hub 4 and the blade 6 together, the hub 4 and the blade 6 are joined together via the adhesive so that the protrusion portion 4e is inserted in the opening 6d. When the protrusion portion 4e is inserted into the opening 6d, the outer peripheral edge 4f of the protrusion portion 4e comes into contact with the blade 6 in the opening 6d and the hub 4 and the blade 6 are arranged in a predetermined positional relation relative to each other. By performing the bonding as described above, the hub 6 and the blade 6 are hence connected together in a mutually aligned state.

The outer peripheral edge 4f of the protrusion portion 4e and the contour of the opening 6d of the blade 6 are not absolutely required to have the same shape insofar as the alignment between the hub 4 and the blade 6 is feasible. For example, the protrusion portion 4e may be formed in a polygonal shape (for example, a square shape) that comes into contact with the blade 6 in the opening 6d. If this is the case, plural vertices included in the outer peripheral edge 4f of the protrusion portion 4e each come into contact with the blade 6 in the opening 6d, whereby the alignment between the hub 4 and the blade 6 is performed. In addition, the protrusion portion 4e preferably has a height (the length in the left and right directions as viewed in FIG. 2) equal to or smaller than a width (the length in the left and right directions as viewed in FIG. 2) of the opening 6d of the blade 6. If this is the case, the protrusion portion 4e does not project from the side of the second side 6b of the blade 6 even when the protrusion portion 4e is inserted into the opening 6d. Upon mounting the hubbed blade 2 on a blade mount 44 fixed on a spindle 40 (see FIG. 4), the protrusion portion 4e therefore remains out of contact with the blade mount 44 so that the mounting of the hubbed blade 2 is not interfered with.

As described above, with the hubbed blade 2 according to this embodiment, the alignment between the hub 4 and the blade 6 is performed by inserting the protrusion portion 4e of the hub 4 into the opening 6d of the blade 6. Therefore, no jig is needed for performing the alignment, thereby enabling to simply and easily perform the alignment between the hub 4 and the blade 6. The outer peripheral edge 6c of the blade 6 has a greater diameter than the outer peripheral edge 4c of the hub 4. When the hub 4 and the blade 6 are connected together, the outer peripheral edge 6c of the blade 6 is hence disposed on an outer side of the outer peripheral edge 4c of the hub 4 in the radial direction of the hub 4, and thus extends outwardly from the outer peripheral edge 4c. Upon performing processing of a workpiece with the hubbed blade 2, work (roundness generation) is performed to allow the blade 6 to cut into a dresser board so that the blade 6 is abraded to dress the blade 6 into a shape concentric with the spindle. Therefore, the center of the hub 4 and that of the blade 6 are not absolutely required to completely coincide with each other at the stage that the hub 4 and the blade 6 have been bonded together.

Figure 3:
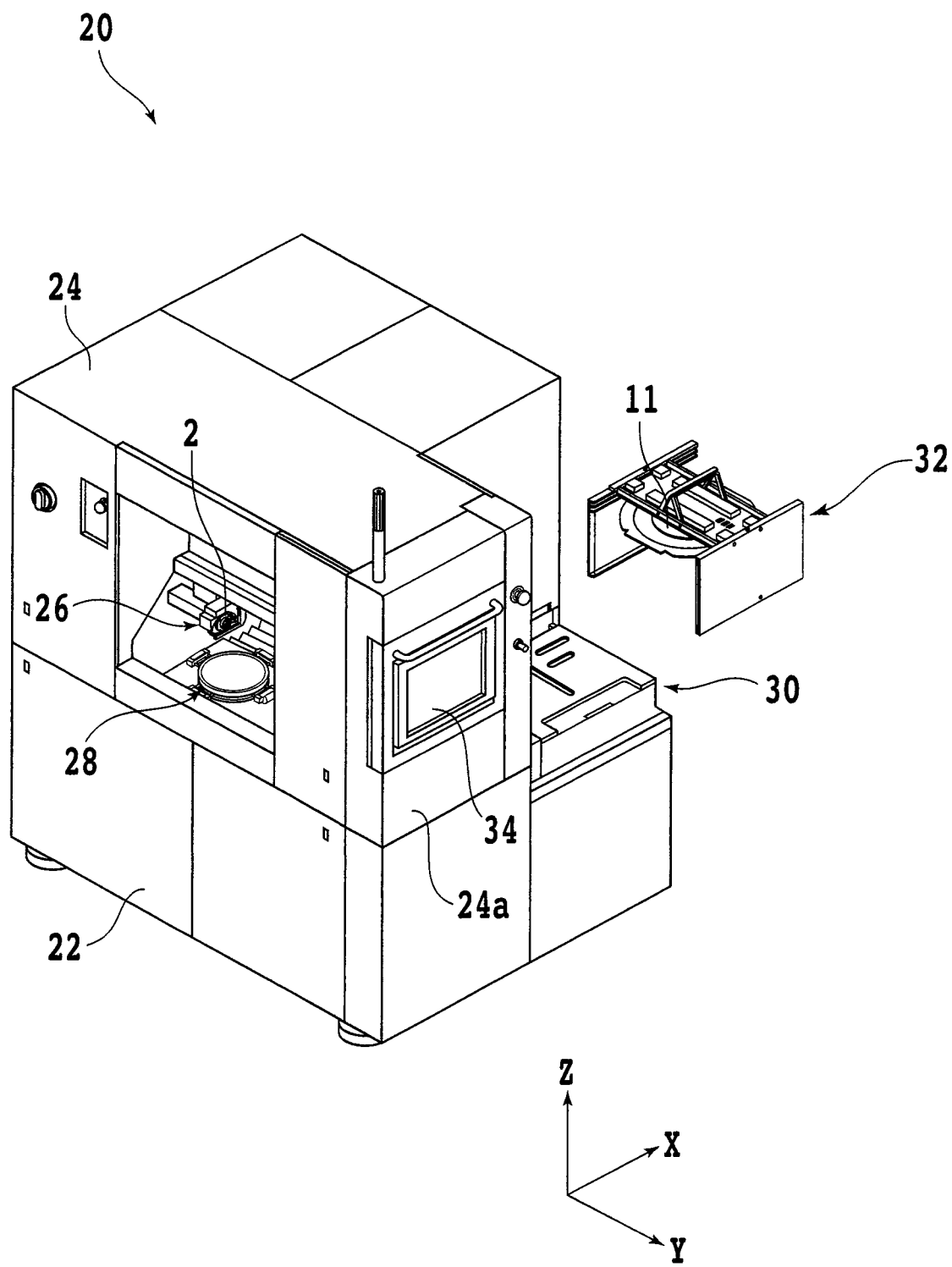
FIG. 3 is a perspective view depicting a cutting apparatus that cuts workpieces with the hubbed blade.

Next, a description will be made about a configuration example of a cutting apparatus that cuts workpieces with the hubbed blade 2. FIG. 3 is a perspective view depicting a cutting apparatus 20 that cuts the workpieces 11. It is to be noted that for the sake of simplification of depiction, FIG. 3 presents only one of the workpieces 11. Examples of the workpieces 11 to be cut by the cutting apparatus 20 include semiconductor wafers each including devices such as ICs or LSIs, and package substrates such as chip size package (CSP) substrates and quad flat non-leaded package (QFN) substrates. However, no limitation is imposed on the kind, material, shape, structure, size and the like of the workpieces 11. For example, the workpieces 11 may be substrates made of ceramic, resin, metal or the like.

The cutting apparatus 20 includes a base 22 that supports various constituent elements, and over the base 22, a cover 24 is disposed enclosing the base 22 on a side of its upper surface. Inside the cover 24, a space is defined to perform processing of each workpiece 11. In this space, a cutting unit 26 is disposed to allow mounting of the hubbed blade 2. The cutting unit 26 is connected to moving mechanisms (not depicted), which move the cutting unit 26 along front and rear directions (Y-axis direction, indexing feed direction) and vertical directions (Z-axis direction).

Below the cutting unit 26, a chuck table 28 is disposed to hold the workpiece 11. The chuck table 28 has a top surface, which constitutes a holding surface that holds the workpiece 11. A suction source (not depicted) is connected to the holding surface via a suction line (not depicted). By applying a negative pressure of the suction source to the holding surface with the workpiece 11 placed on the chuck table 28, the workpiece 11 is held under suction by the chuck table 28. The chuck table 28 is connected to a moving mechanism (not depicted), which moves the chuck table 28 in left and right directions (X-axis direction, processing feed direction). The chuck table 28 is also connected to a rotating mechanism (not depicted), which rotates the chuck table 28 about an axis of rotation that is substantially parallel to the vertical directions (Z-axis direction).

In addition, a cassette elevator 30 is disposed in a front corner section of the base 22. On a top surface of the cassette elevator 30, a cassette 32 that can accommodate the workpieces 11 is mounted. The cassette elevator 30 is configured to be movable up and down, and the height (position in the vertical directions) of the cassette 32 is adjusted so that any desired one of the workpieces 11 is appropriately carried out and carried in.

On a side of a front side 24a of the cover 24, a touch panel monitor 34 is disposed as a user interface. Similar to the cutting unit 26, the moving mechanisms connected to the cutting unit 26, the chuck table 28, the moving mechanism and rotating mechanism connected to the chuck table 28, the cassette elevator 30, and the like, this monitor 34 is also connected to a control unit (not depicted) that controls operations of the individual constituent elements of the cutting apparatus 20.

Figure 4:
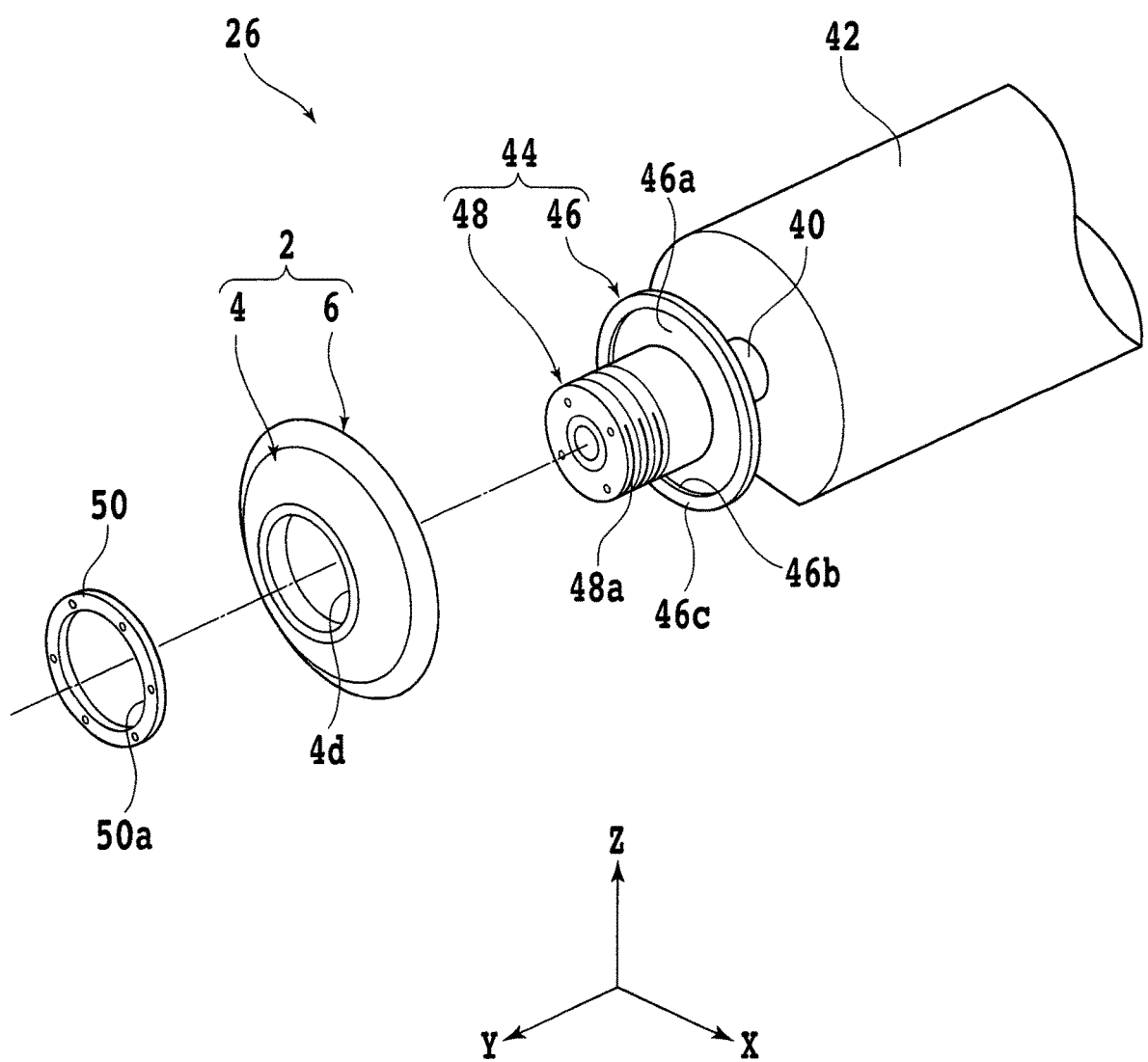
FIG. 4 is an exploded perspective view depicting a cutting unit on which the hubbed blade is mounted.

FIG. 4 is an exploded perspective view of the cutting unit 26. The cutting unit 26 includes the spindle 40 disposed along the Y-axis direction. The spindle 40 is accommodated in a cylindrical spindle housing 42. The spindle 40 is exposed to an outside of the spindle housing 42 at the distal end portion (an end portion) thereof, and the blade mount 44 is fixed on the distal end portion of the spindle 40. To a side of an opposite end (proximal end) of the spindle 40, a motor (not depicted) is connected to rotate the spindle 40.

The blade mount 44 includes a disk-shaped flange portion (fixed flange) 46, and a support shaft 48 extending from a central portion of a surface 46a of the flange portion 46. On a side of the surface 46a of an outer peripheral portion of the flange 46, a circular protrusion portion 46b is disposed protruding from the surface 46a. The protrusion portion 46b includes an end face 46c on an end thereof, and the end face 46c is formed substantially parallel to the surface 46a. The support shaft 48 is formed in a cylindrical shape, and a thread ridge 48a is formed on an outer peripheral surface of a distal end portion of the support shaft 48. When the support shaft 48 is inserted into the opening 4d of the hub 4 of the hubbed blade 2, the hubbed blade 2 is mounted on the blade mount 44.

On the distal end portion of the support shaft 48, a circular lock nut 50 is fastened. Through a center of the lock nut 50, a circular opening 50a of a diameter corresponding to that of the support shaft 48 is formed. In an inner peripheral surface of the opening 50a, a thread groove (not depicted) is formed corresponding to the thread ridge 48a formed on the support shaft 48. When the lock nut 50 is fastened on the thread ridge 48a of the support shaft 48 with the support shaft 48 inserted in the opening 4d of the hub 4, the hubbed blade 2 is held by the first surface 4a (see FIG. 1, etc.) of the hub 4 and the protrusion portion 46b of the flange portion 46. As a consequence, the blade 6 is fixed on the distal end portion of the spindle 40.

When the spindle 40 is rotated with the hubbed blade 2 mounted on the cutting unit 26, the hubbed blade 2 rotates about an axis of the spindle 40. By then allowing the rotating blade 6 to cut into the workpiece 11 held on the chuck table 28 (see FIG. 3), the workpiece 11 is cut.

As described above, the hubbed blade 2 according to this embodiment includes the circular hub 4 and the circular blade 6 fixed on the side of the first side 4a of the hub 4 and having the opening 6d formed through the center thereof. The hub 4 includes the protrusion portion 4e protruding from the first side 4a and having the outer peripheral edge 4f of the shape corresponding to the shape of the opening 6d.

The hub 4 and the blade 6 are connected together via the adhesive with the hub 4 and the blade 6 being aligned each other with the protrusion portion 4e inserted in the opening 6d. With this hubbed blade 2, the alignment between the hub 4 and the blade 6 is performed by inserting the protrusion portion 4e of the hub 4 into the opening 6d of the blade 6. Therefore, no jig is needed for performing the alignment, thereby enabling to simply and easily perform the alignment between the hub 4 and the blade 6.

Figure 5:
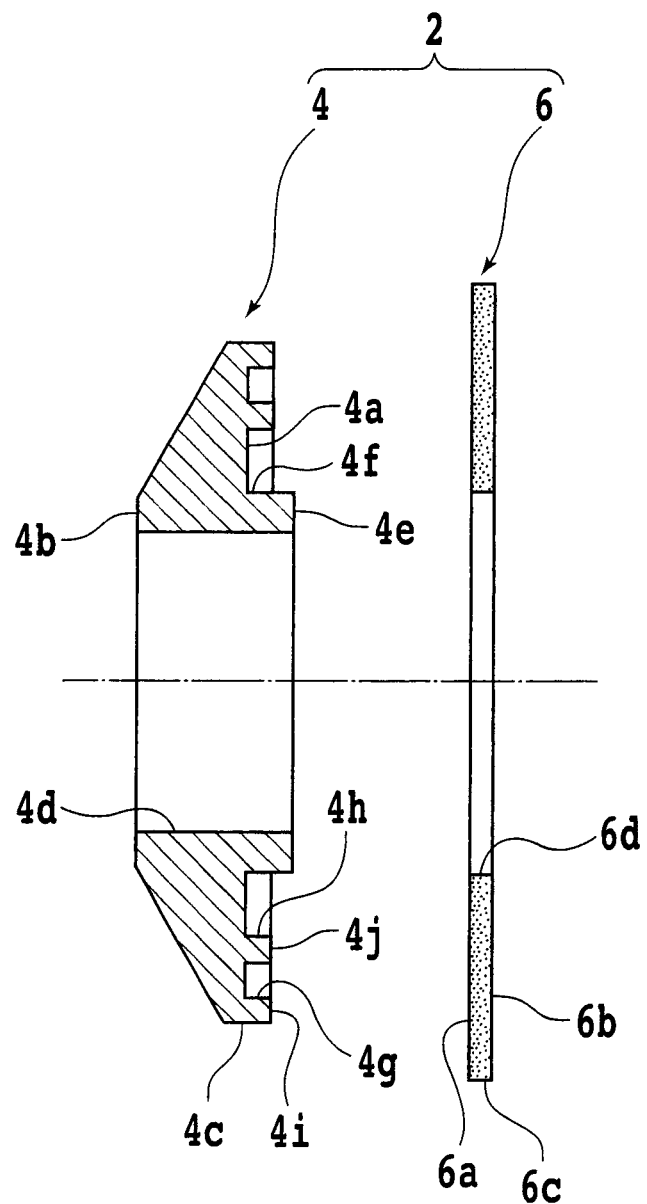
FIG. 5 is an exploded cross-sectional view depicting a hubbed blade according to a modification of the embodiment.

In the above-described embodiment, the description is made about the example where the blade 6 is fixed in contact with the first side 4a of the hub 4. However, the manner of fixing of the blade 6 is not limited to the example. For example, the blade 6 may be fixed in contact with an end face or end faces of one or more protrusion portions protruding from the first side 4a of the hub 4. FIG. 5 is an exploded cross-sectional view of a hubbed blade 2 according to a modification of the embodiment.

In the hubbed blade 2 depicted in FIG. 5, a first circular protrusion portion 4g is disposed on the outer peripheral portion of the hub 4, protruding from the first side 4a toward the blade 6 along the outer peripheral edge 4c. Further, on an inner side than the first circular protrusion portion 4g in the radial direction of the hub 4 and in an area on an outer side than the protrusion portion 4e in the radial direction of the hub 4, a second circular protrusion portion 4h is disposed protruding from the first side 4a toward the blade 6 with a distance from the protrusion portion 4e and also with a distance from the first circular protrusion portion 4g. The first circular protrusion portion 4g and the second circular protrusion portion 4h are concentrically formed surrounding the opening 4d. Furthermore, the first circular protrusion portion 4g has an end face (first end face 4i), and the second circular protrusion portion 4h has an end face (second end face 4j). The first end face 4i and the second end face 4j are formed substantially parallel to the first side 4a. The first circular protrusion portion 4g and the second circular protrusion portion 4h are formed so that the amount of their protrusion from the first side 4a is smaller than the amount of protrusion of the protrusion portion 4e, which is formed around the opening 4d, from the first side 4a.

The blade 6 is fixed with the first side 6a maintained in contact with the first end face 4i and the second end face 4j. Upon bonding the hub 4 and the blade 6 together, it is preferred to apply an adhesive to the second end face 4j without applying the adhesive to the first end face 4i. In this manner, the adhesive applied to the hub 4 is less prone to spread out toward the outer peripheral edge 6c of the blade 6, thereby preventing the quality of the hubbed blade 2 from being lowered.

It should be noted that the structure, method and the like relating to the above-described embodiment can be practiced with modifications as needed to an extent not departing from the scope of the object of the present invention.

The present invention is not limited to the details of the above-described preferred embodiment. The scope of the invention is defined by the appended claim and all changes and modifications as fall within the equivalence of the scope of the claim are therefore to be embraced by the invention.

What is claimed is:

1. A hubbed blade to be mounted on a spindle, comprising:
   a circular hub; and
   a circular blade having an inner side and being fixed on a first side of the hub and having an opening formed through a center therethrough,
   the hub including a protrusion portion protruding from the first side and having an outer peripheral edge of a shape corresponding to a shape of the opening, a first circular protrusion portion disposed on an outer peripheral portion of the hub, wherein said first circular protrusion portion protrudes from the first side of the hub toward the blade, a second circular protrusion portion protruding from the first side of the hub toward the blade, said second circular protrusion portion being spaced from said first circular protrusion portion in a radial direction along the hub, wherein an amount that said first circular protrusion portion and said second circular protrusion portion protrudes from said first side of the hub is less than an amount that the protrusion portion protrudes from said first side of the hub, and the hub and the blade are connected together via an adhesive with the hub and the blade being aligned with each other with the protrusion portion inserted in the opening, wherein the protrusion portion extends at least partially into but not completely through the opening such that the inner side of the blade forms an inner side of the hubbed blade.

2. The hubbed blade of claim 1, wherein said first circular protrusion portion and said second circular protrusion portion are concentric to each other.

3. A hubbed blade to be mounted on a spindle, comprising:

a circular hub;

a circular blade fixed on a side of a first side of the hub and having an opening formed through a center therethrough;

the hub including a protrusion portion protruding from the first side and having an outer peripheral edge of a shape corresponding to a shape of the opening, and the hub and the blade being connected together via an adhesive with the hub and the blade being aligned with each other with the protrusion portion inserted in the opening, a first circular protrusion portion disposed on an outer peripheral portion of the hub, said first circular protrusion portion protruding from the first side of the hub toward the blade; and a second circular protrusion portion protruding from the first side of the hub toward the blade, said second circular protrusion portion being spaced from said first circular protrusion portion in a radial direction along the hub, wherein an amount that said first circular protrusion portion and said second circular protrusion portion protrudes from said first side of the hub is less than an amount that the protrusion portion protrudes from said first side of the hub.

4. The hubbed blade of claim 3, wherein said first circular protrusion portion and said second circular protrusion portion are concentric to each other.

\* \* \* \* \*